(12) United States Patent
Hackl et al.

(10) Patent No.: US 11,456,589 B2
(45) Date of Patent: Sep. 27, 2022

(54) METHODS AND DEVICES FOR SELECTIVE INSULATION MONITORING IN UNGROUNDED ISOLÉ TERRE (IT) POWER SUPPLY SYSTEMS

(71) Applicant: Bender GmbH & Co. KG, Gruenberg (DE)

(72) Inventors: Dieter Hackl, Fernwald (DE); Oliver Schaefer, Gruenberg (DE)

(73) Assignee: BENDER GMBH & CO. KG, Gruenberg (DE)

( * ) Notice: Subject to any disclaimer, the term of this patent is extended or adjusted under 35 U.S.C. 154(b) by 316 days.

(21) Appl. No.: 16/899,249

(22) Filed: Jun. 11, 2020

(65) Prior Publication Data
US 2020/0303917 A1    Sep. 24, 2020

Related U.S. Application Data

(62) Division of application No. 14/637,512, filed on Mar. 4, 2015, now Pat. No. 10,784,674.

(30) Foreign Application Priority Data

Mar. 5, 2014    (DE) .................... 10 2014 204 038.8

(51) Int. Cl.
*H02H 3/16*    (2006.01)
*H02H 3/40*    (2006.01)
(Continued)

(52) U.S. Cl.
CPC .............. *H02H 3/162* (2013.01); *G01R 31/12* (2013.01); *G01R 31/42* (2013.01); *G01R 31/52* (2020.01); *H02H 3/40* (2013.01); *H02M 1/36* (2013.01)

(58) Field of Classification Search
CPC .......... H02H 3/162; H02H 3/40; G01R 31/12; G01R 31/42; G01R 31/52; G01R 27/025; H02M 1/36
(Continued)

(56) References Cited

U.S. PATENT DOCUMENTS 3,599,045 A    8/1971  Farinas
3,978,400 A    8/1976  Pettit
(Continued)

FOREIGN PATENT DOCUMENTS

AT    199255 B    8/1958
CN    101261301 A    9/2008
(Continued)

OTHER PUBLICATIONS

The Patent Office of the People's Republic of China, First Office Action and Search Report, Application No. 201510097362.1, dated Mar. 29, 2018, 14 pages [English Language Translation Only].

*Primary Examiner* — Dharti H Patel
(74) *Attorney, Agent, or Firm* — Quarles & Brady LLP

(57) ABSTRACT

Methods and devices for insulation monitoring of an ungrounded IT power supply system having at least two phase conductors includes determining an insulation resistance separately for each phase conductor using a separate response value. In one embodiment of the invention, relevant current and voltage distributions are calculated. In another embodiment, a change time window is set within which a second response value is activated. In yet another embodiment, an option of shutting down/continuing operation of the IT power supply system is offered.

4 Claims, 3 Drawing Sheets

(51) Int. Cl.
  *G01R 31/52* (2020.01)
  *G01R 31/12* (2020.01)
  *G01R 31/42* (2006.01)
  *H02M 1/36* (2007.01)

(58) Field of Classification Search
  USPC .......................................................... 361/47
  See application file for complete search history.

(56) References Cited

U.S. PATENT DOCUMENTS

| | | | |
|---|---|---|---|
| 5,537,283 | A | 7/1996 | Keese |
| 5,818,236 | A | 10/1998 | Sone et al. |
| 6,392,422 | B1 * | 5/2002 | Kammer ................. H02H 1/06 |
| | | | 324/509 |
| 6,718,271 | B1 | 4/2004 | Tobin |
| 9,069,025 | B2 | 6/2015 | Schaefer et al. |
| 9,632,131 | B2 | 4/2017 | Broeckmann et al. |
| 2008/0007277 | A1 | 1/2008 | Backhaus |
| 2012/0126839 | A1 | 5/2012 | Schaefer et al. |
| 2012/0262183 | A1 | 10/2012 | Kawamura |
| 2014/0062492 | A1 * | 3/2014 | Boxshall ............ G01R 31/1272 |
| | | | 324/415 |
| 2015/0226781 | A1 | 8/2015 | Sun et al. |
| 2020/0303917 | A1 * | 9/2020 | Hackl ...................... H02H 3/40 |

FOREIGN PATENT DOCUMENTS

| | | |
|---|---|---|
| DE | 3528148 A1 | 2/1987 |
| DE | 102011084361 A1 | 4/2013 |
| EP | 1930737 A1 | 6/2008 |
| WO | 9820356 A1 | 5/1998 |

* cited by examiner

Fig. 2
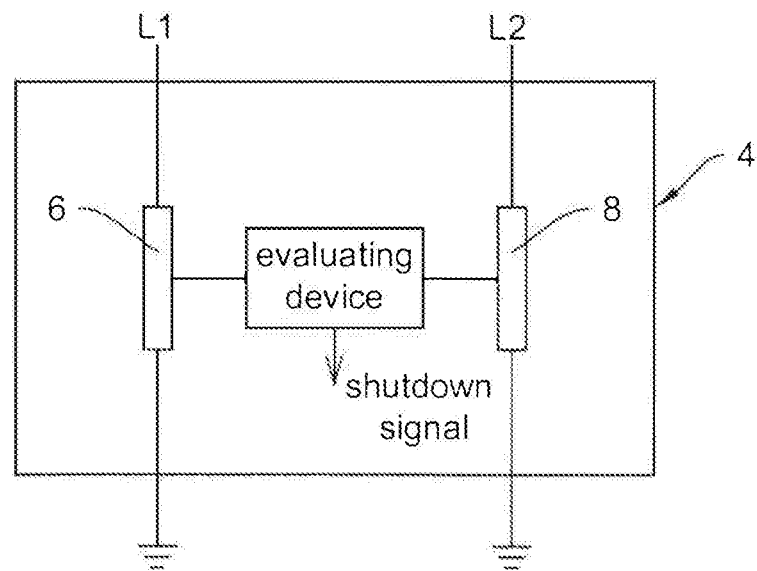
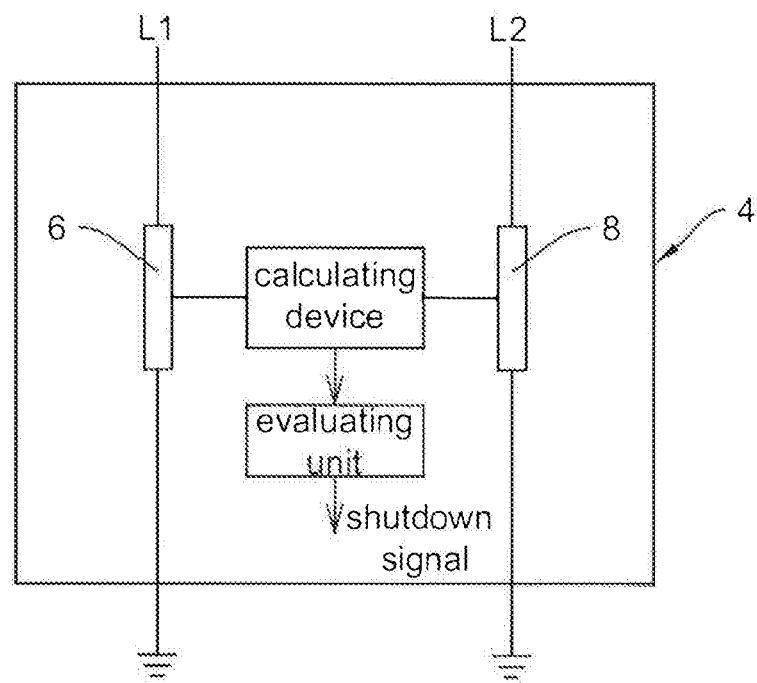
Fig. 3

METHODS AND DEVICES FOR SELECTIVE INSULATION MONITORING IN UNGROUNDED ISOLÉ TERRE (IT) POWER SUPPLY SYSTEMS

CROSS-REFERENCE TO RELATED APPLICATIONS

This application is a divisional application of U.S. patent application Ser. No. 14/637,512 filed on Mach 4, 2015 which claims priority to German Patent Application No. 10 2014 204 038.8 filed on Mar. 5, 2014, Each of these disclosures is hereby fully incorporated herein by reference.

STATEMENT REGARDING FEDERALLY SPONSORED RESEARCH OR DEVELOPMENT

Not applicable.

FIELD OF THE INVENTION

The invention relates to a method for insulation monitoring of an ungrounded Isolé Terre (IT) power supply system having at least two phase conductors and to a method of this kind involving the determination of an insulation resistance of the IT power supply system and the setting of a first response value.

Furthermore, the invention relates to a device for insulation monitoring of an ungrounded IT power supply system having at least two phase conductors and to a device of this kind comprising a detecting device for determining an insulation resistance of the power supply system, the detecting device having a first-fault recognition device using an adjustable first response value for the insulation resistance for recognizing a first fault.

BACKGROUND OF THE INVENTION

In case of increased requirements regarding operational, fire and contact safety, the network type of an IT power supply system (isolated power supply network) is used to supply electrical equipment. In this type of power supply network, the active components of the electrical system are separated from the ground potential. The advantage of these networks is that in case of a first insulation fault (ground fault or fault to frame), the function of the electrical equipment is not affected since no closed circuit can form in this first fault case because of the ideally infinitely high impedance value between the conductor and ground.

Owing to the inherent safety of the IT power supply system, a continuous power supply of the loads fed by the IT power supply system, i.e. of the equipment connected to the IT power supply system, can be ensured even if a first insulation fault occurs.

It becomes clear from this consideration that the resistance against ground in the network to be monitored (insulation resistance—in the fault case also insulation fault resistance or fault resistance) must be constantly monitored because a potential other fault in another active conductor (second fault) would lead to a fault loop and the thus flowing fault current in connection with an overcurrent protection device would result in a shutdown of the system and in operational downtime.

Provided that the state of insulation of the IT power supply system is continuously monitored by an insulation monitoring device, the IT power supply system can thus be operated without a prescribed time limitation even in case of a first fault. This is described, for example, in DIN VDE 0100-410 and in IEC 60364-4-41 in part 411. In case of a second fault, the protective measure "automatic shutdown" is demanded if no additional safeguards are present.

However, the reliable recognition of a second fault, in particular of a high-resistance fault, is a problem that has not been sufficiently solved so far. As a result of an unrecognized high-resistance second fault, an overcurrent trigger may not happen reliably; instead, a risk of electric shock and/or a fire hazard are highly likely.

In the aforementioned standards, the use of overcurrent circuit breakers and the use of differential current circuit breakers (residual-current protective devices—RCD) are mentioned as other protective measures. In IT power supply systems, however, these two safeguards are insufficient to reliably prevent a risk from electric shock and/or the occurrence of fires because the trigger threshold of an overcurrent circuit breaker is based on short-circuit currents or on the current-carrying capacity of lines and thus it is many times higher than the values of the residual currents that are considered critical when running through a human or an animal.

The residual-current limit value of 300 mA currently used for fire prevention will not suffice to trigger an overcurrent circuit breaker, either.

Whether a second fault occurring in an IT power supply system will trigger a residual-current protective device depends on the location of the first fault, the location of the second fault, the location of the residual-current protective device and on other leakage impedances of the electrical system present against ground.

Unlike in TN power supply systems, there is no low-resistance connection of the neutral conductor and/or of a neutral point to ground upstream of the differential current transformer of the residual current protective device in IT power supply systems so that a differential current flowing outside of the transformer could trigger the residual current protective device.

Hence, it is to be considered highly unlikely that the second fault in an IT power supply system would trigger the residual current protective device.

With the insulation monitoring devices currently available on the market, recognition of a second fault or a directed shutdown of the IT power supply system to be monitored if a critical state is reached is not possible because only the parallel connection of the insulation resistances emanating from the respective phase conductors in the IT network is considered.

SUMMARY OF THE INVENTION

Therefore, it is the object of the present invention to propose a method and a device that ensure reliable recognition of the second fault in an IT power supply system or that help avoid the occurrence of a second fault. Recognition of the second fault is supposed to shut down the IT power supply system if a state of the system that poses high risk of electrical shock and/or a state of the power supply system that poses an untenable risk of fire is to be assumed.

The object is attained by a method comprising the following method steps: determining an insulation resistance between each phase conductor and ground, setting an independent response value for each determined insulation resistance, testing each response value for undercutting by the associated insulation resistance, and generating a shutdown signal for shutting down the IT power supply system if at least two independent response values are undercut.

In this first embodiment according to the invention, first, the insulation resistance is determined selectively for each individual phase conductor by forming a separate coupling and measuring path for said phase conductor. The thus determined insulation resistances are associated with a response value that is independent of the other individually determined insulation resistances, wherein network parameters such as leakage impedances of the respective measuring path can be taken into account. The preset response values are tested to see whether the associated, currently determined insulation resistance falls short of the respective response value. A shutdown signal for shutting down the IT power supply system is generated if at least two independent response values are undercut. This test for the presence of multiple insulation faults ensures that a second fault on another phase conductor is recognized, meaning the system is in a dangerous state that makes it necessary to shut down the IT power supply system.

In another embodiment of the method, an alarm signal associated with the respective phase conductor is triggered if the response value is undercut. Undercutting of a response value on a measuring path relating to the respective phase conductor corresponds to a selective triggering of an alarm signal. Through these alarm signals associated with the individual phase conductor, phase conductor-related information on existing insulation faults is available for further processing and in particular for evaluation of the state of the system.

Advantageously, the shutdown signal is generated by way of a logic operation of the alarm signals. The selectively provided alarm signals allow a logic operation in such a manner that the presence of an undercutting of the response value on at least two measuring paths, i.e. a multiple insulation fault, can be detected.

In an alternative, second embodiment according to the invention, the method comprises the method steps of: determining an insulation resistance between each phase conductor and ground, determining a system voltage between the phase conductors and ground, calculating relevant currents and voltages in the IT power supply system and on equipment connected thereto based on the determined insulation resistances and on the determined system voltages taking into account further electrical characteristics of the IT power supply system, evaluating whether the determined currents and the determined voltages represent a dangerous state of the system, and generating a shutdown signal to shut down the IT power supply system if a dangerous state of the system is recognized.

In this embodiment, the selective determination of the insulation resistances is supplemented by a determination of the system voltage between the phase conductors and ground. Currents and voltages, in particular fault currents and contact voltages, can be calculated for relevant parts of the IT power supply system based on these values by applying basic electro-technical rules for calculating linear networks and taking into account further electrical characteristics of the IT power supply system, such as the protective-conductor resistance or the grounding resistance. In an evaluation, a determination is made as to whether the system is in a dangerous state, for example whether a risk has developed with regard to protection against electric shock or fire prevention because of undercutting of previously set limit values for maximally admissible currents and voltages in certain sections of the system or on connected equipment. If such a dangerous state of the system is recognized, the IT power supply system is shut down.

Preferably, the determined currents and the determined voltages are evaluated by means of evaluation algorithms to recognize a dangerous state of the system. Standard specifications and empirical values can enter into said evaluation algorithms so as to be able to reliably detect a dangerous state of the system.

The afore-described methods do not cover the fault case in which a second fault occurs on the same phase conductor against ground as the first fault. Thus, in the following, a third method according to the invention will be described, by means of which said fault case can be detected.

In this further method, after the first response value has been undercut, a change time window is started within which a set second response value is activated and in that the IT power supply system is automatically shut down if the second response value is undercut within the change time window.

After a first fault has been recognized, i.e. after the currently determined insulation resistance has fallen short of the first response value, a change time window is started within which a second response value is activated as another limit value for the insulation resistance below the first response value. If this second response value is undercut within the change time window, this suggests that the system is in a dangerous state—probably due to second insulation fault—and the IT power supply system is automatically shut down.

In another embodiment, the duration of the change time window and the level of the second response value are determined as a function of at least one of the following network parameters: current value of the insulation resistance, network leakage capacitance, system voltage and displacement voltage between the phase conductors.

To increase the reliability of recognition of the second fault in the sense of increased operational safety and to preclude false alarms, the duration of the change time window and the level of the second response value for the insulation resistance can be adapted to the characteristics/ network parameters of the IT power supply system. The temporal variability of the change time window and the level of the second response value thus take into account the particular electrical properties of the considered IT power supply system on the one hand. On the other hand, different protection objectives such as protection against electric shock and the fire risk can be prioritized. Moreover, other characteristics of the IT power supply system, such as the protective conductor resistance, the resistance of the active conductors (phase conductors) or the ground resistance, can be taken into account when setting the duration of the change time window and the level of the second response value.

In the afore-described third method, a second fault within a change time window can only be reliably recognized if the resistance of the first fault is high enough for a further drop of the insulation resistance due to a second fault to still be recognized in a sufficiently exact manner. In case of a low-resistance first fault, this method proves less suitable. Hence, the following method is described for said case.

Alternatively to the automated shutdown within a change time window, in case of a first fault having a low insulation fault resistance, the user is offered an option of manually shutting down the IT power supply system or of continuing operation.

If the insulation fault resistance occurring with the first fault is low, the use has the option to continue operating the IT power supply system or to shut it down. Although the continued operation is the actual purpose of the IT power supply system, the user still has the option of manually shutting down the IT power supply system in view of avoiding possible danger.

In an advantageous embodiment, a threshold value can be preset below which the insulation fault resistance is recognized as having a low resistance.

The resistance value at which the determined insulation resistance is considered to have a low resistance can be defined as a function of the electrical characteristics of the IT power supply system.

With respect to a device implementing the first method according to the invention, the object is attained by a coupling circuit implemented separately for each phase conductor for measuring an insulation resistance between the phase conductor and ground and by an evaluating device for setting an independent response value for each determined insulation resistance, for testing each response value for undercutting by the associated insulation resistance and for generating a shutdown signal to shut down the IT power supply system if at least two independent response values have been undercut.

With the separately implemented coupling circuit, an individual coupling and measuring path whose insulation resistance can be measured is produced for each phase conductor. This selective determination of the insulation resistance allows detection of a second fault on another phase conductor by testing the individual response values for undercutting. If a multiple insulation fault is detected, a shutdown signal is generated to shut down the IT power supply system.

In another preferred embodiment, the evaluating device has an alarm output for each phase conductor at which an alarm signal for reporting the undercutting of the respective response value can be tapped.

As each phase conductor has its own alarm output, it can be immediately recognized and signaled at which phase conductor an insulation fault has occurred. Thus, an alarm signal is available for each phase conductor that selectively provides information about the insulation level of the IT power supply system. Advantageously, the alarm signal is used for further evaluation of the state of the system.

Advantageously, the evaluating device has a basic logic circuit for a logic operation of the alarm signals.

The alarm signals selectively available at the alarm outputs allow a multiple insulation fault to be detected by way of a simple logic operation of the alarm signals.

With regard to a device implementing the second method according to the invention, the object is attained by a coupling circuit implemented separately for each phase conductor for measuring an insulation resistance between the respective phase conductor and ground and for measuring the system voltage between the respective phase conductor and ground, a calculating device for calculating relevant currents and voltages in the IT power supply system and on equipment connected thereto, an evaluating unit that performs evaluation algorithms to recognize a dangerous state of the system and that generates a shutdown signal to shut down the IT power supply system if the system is in a dangerous state.

In addition to selectively determining the insulation resistance prevalent for each phase conductor, the coupling circuit present separately for each phase conductor simultaneously allows measuring the respective system voltage between the respective phase conductor and ground. In the calculating device, currents and voltages are measured for areas at risk or parts of the electrical system posing a danger, taking into account further electrical characteristics of the IT power supply system. Thus, states of the system of differing potential of danger are registered. In the evaluating unit, evaluation (calculation) rules are implemented that describe the electrical state of the relevant system parts as a result of the evaluation. If a dangerous state is present, for example due to an insulation resistance that has fallen below a limit value or due to an excess leakage current, a shutdown signal causes the IT power supply system to shut down.

A circuitry-based realization of the third method according to the invention is characterized in that for recognizing a second fault, the detecting device comprises a second-fault recognition device having an adjusting device for setting a second response value for the insulation resistance, comprising an interval timer for defining a change time window and comprising a switch-signal unit that generates a shutdown signal to automatically shut down the IT power supply system if the second response value is undercut within the change time window.

In addition to the first-fault recognition device known from the state of the art, the detecting device comprises a second-fault recognition device. Said second-fault recognition device comprises an adjusting device for setting a second response value for the insulation resistance, an interval timer and a switch-signal unit. If the second response value is undercut by the currently measured insulation resistance after the undercutting of the first response value and during the change time window defined by the interval timer, the switch-signal unit generates a shutdown signal to automatically shut down the IT power supply system.

A device corresponding to a fourth method according to the invention for attaining the object is characterized in that said device has a threshold value detector for testing whether the determined insulation resistance has a resistance value below a preset threshold value and by a decision device that offers the user an option of manually shutting down the IT power supply system or of continuing operation.

In case of a first insulation fault evaluated as having a low resistance, the user is thus offered the option of shutting down the system contrary to the objective of an IT power supply system.

BRIEF DESCRIPTION OF THE DRAWINGS

The following drawings illustrate the purpose of the present invention by way of example.

FIG. 2 shows an IT power supply system including an evaluating device for setting an independent response value for each determined insulation resistance;

FIG. 3 shows an IT power supply system including an evaluating device and a calculating device;

DETAILED DESCRIPTION OF THE EXAMPLE EMBODIMENTS

Figure 1:
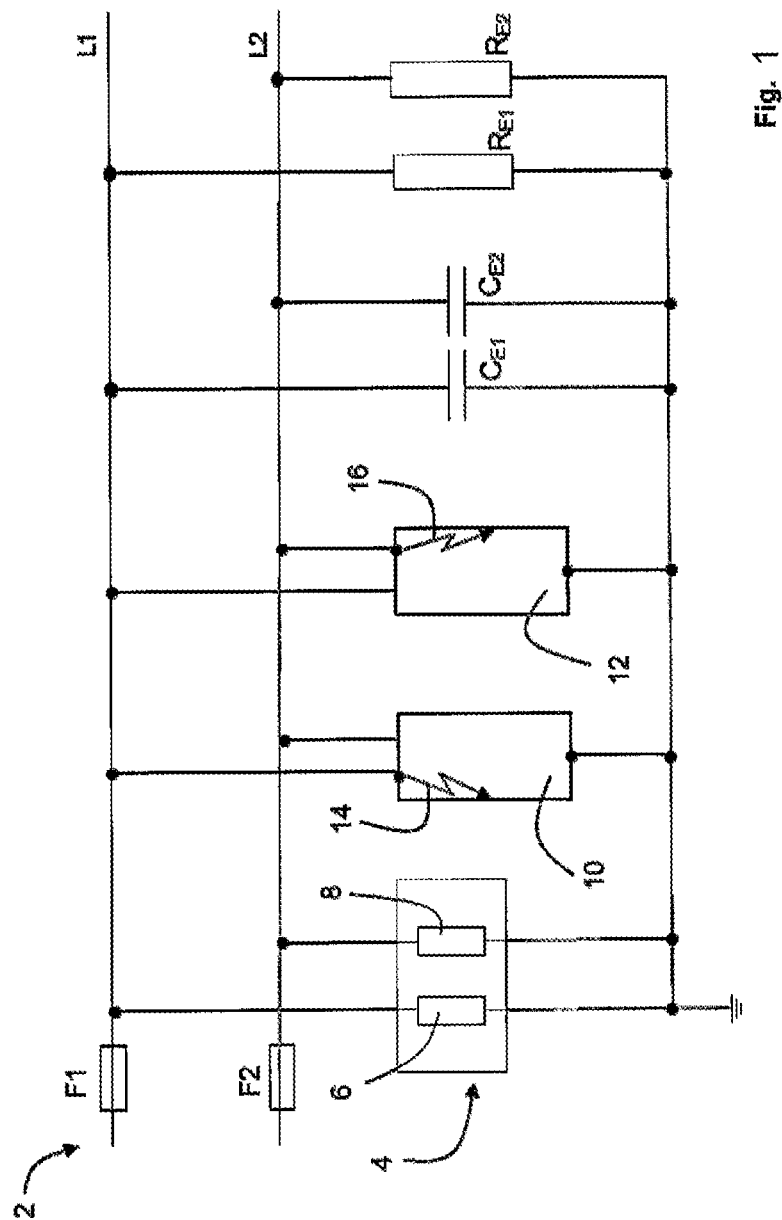
FIG. 1 shows an IT power supply system using a device according to the invention for insulation monitoring.
Figure 4:
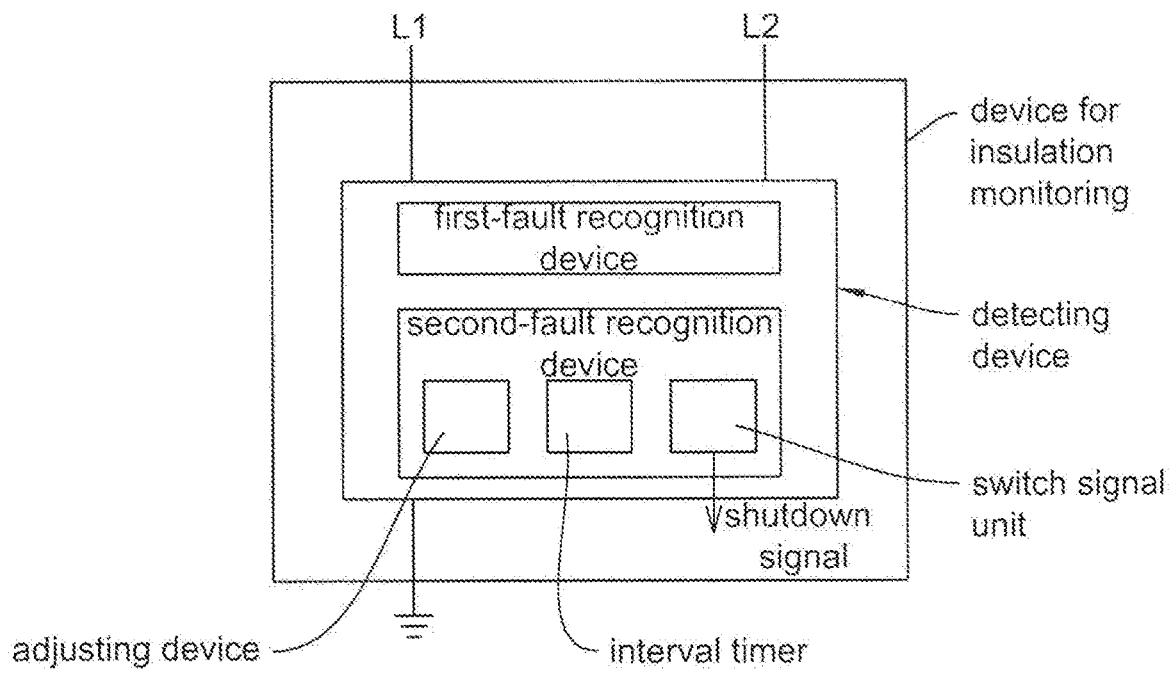
FIG. 4 shows an IT power supply system including first and second fault recognition devices.
Figure 5:
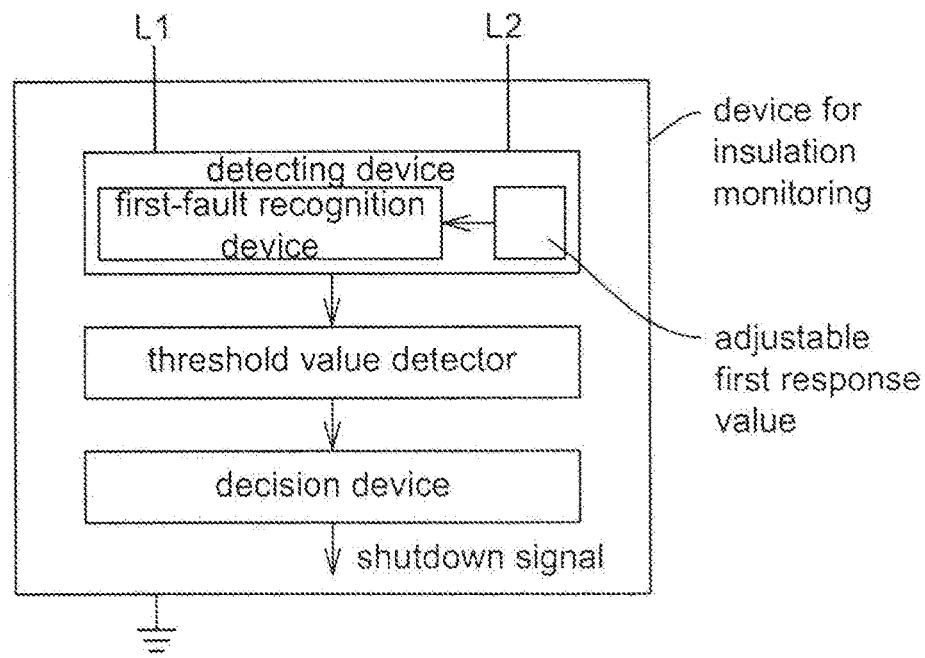
FIG. 5 shows an IT power supply system including a detecting device including a first fault recognition device and an adjustable response value, a threshold value detector, and a decision device.

In the Fig., an IT power supply system 2 having two phase conductors L1 and L2 is illustrated, which can be designed as an alternating-current or direct-current system. The methods according to the invention and the devices according to the invention are equally applicable in alternating-current or direct-current IT power supply systems. The insulation resistance of the IT power supply system 2 is monitored by a device 4 according to the invention that is connected between the respective phase conductors L1, L2 and ground and, in the present example, has a separate coupling circuit 6, 8 for each of the two phase conductors L1, L2 according to the first or second embodiment. Additionally, overcurrent protection devices F1, F2 are provided for each phase conductor L1, L2.

In the fault-free case, the IT power supply system 2 is characterized by a complex-value insulation resistance/complex-value leakage impedance as a network parameter or electrical characteristic that is substantially determined by the parallel connection of the resistive components $R_{E1}$ and $R_{E2}$ emanating from the two phase conductors L1 and L2 and by the leakage capacitances $C_{E1}$ and $C_{E2}$.

First and a second equipments 10, 12 are connected to the IT power supply network 2. In the case at hand, a first fault 14 has occurred on the first equipment 10 and a second fault 16 has occurred on the second equipment 12, both faults 14, 16 being illustrated as direct faults to frame. In consequence of the first fault 14, the IT power supply network 2 has turned into a network that is comparable to a grounded network so that the second fault 16 leads to a closed fault circuit. If the faults to frame have a negligible impedance and, accordingly, a sufficiently high short-circuit current is flowing, the overcurrent protection devices F1, F2 will be triggered. In case of faults having an impedance, however, it is not ensured that the overcurrent protective devices F1, F2 are triggered so that currents can flow that are dangerous even below the trigger threshold.

Since according to the state of the art an insulation monitoring device only evaluates the insulation resistance that results from the parallel connection of the leakage impedances emanating from the phase conductors L1, L2, only a drop of the total insulation resistance can be detected but not a fault circuit that results from two faults 14, 16 on different phase conductors L1, L2.

As the exemplarily illustrated device 4 according to the invention has two separate coupling circuits 6, 8, a drop of the insulation resistance relating to a specific phase conductor L1, L2 can be recognized, and thus a second fault 16 can be detected. Upon recognition of the first and of the second fault 16, the phase conductor-related insulation resistances are known and current and voltage distributions on relevant sections within the IT power supply network can be calculated, from which, in turn, a statement regarding the state of the system can be derived using suitable evaluation algorithms.

The invention claimed is:

1. A method for insulation monitoring of an ungrounded IT power supply system having at least two phase conductors, comprising the method steps of:
   determining an insulation resistance of the IT power supply system and setting a first response value,
   once the first response value has been undercut, starting a change time window within which a set second response value is activated, and
   automatically shutting down the IT power supply system if the second response value is undercut within the change time window.

2. The method according to claim 1, further comprising the step of determining a duration of the change time window as a function of at least one of the following network parameters: current value of the insulation resistance, network leakage capacitance, system voltage and displacement voltage between the phase conductors.

3. The method according to claim 1, further comprising the step of determining a level of the second response value as a function of at least one of the following network parameters: current value of the insulation resistance, network leakage capacitance, system voltage and displacement voltage between the phase conductors.

4. A device for insulation monitoring of an ungrounded IT power supply system having at least two phase conductors, comprising a detecting device for determining an insulation resistance value of the power supply system, the detecting device, for recognizing a first fault, comprising a first-fault recognition device having an adjustable first response value for the insulation resistance, wherein for recognizing a second fault, the detecting device comprises a second-fault recognition device having an adjusting device for setting a second response value for the insulation resistance, comprising an interval timer for defining a change time window and comprising a switch-signal unit that generates a shutdown signal to automatically shut down the IT power supply system if the second response value is undercut within the change time window.

* * * * *